United States Patent
Hwang et al.

(10) Patent No.: US 11,257,714 B2
(45) Date of Patent: Feb. 22, 2022

(54) METHOD OF MAKING A PILLAR STRUCTURE HAVING A NON-METAL SIDEWALL PROTECTION STRUCTURE AND INTEGRATED CIRCUIT INCLUDING THE SAME

(71) Applicant: TAIWAN SEMICONDUCTOR MANUFACTURING COMPANY, LTD., Hsinchu (TW)

(72) Inventors: Chien Ling Hwang, Hsinchu (TW); Yi-Wen Wu, Xizhi (TW); Chun-Chieh Wang, Beigang Township (TW); Chung-Shi Liu, Shin-Chu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 14/804,813

(22) Filed: Jul. 21, 2015

(65) Prior Publication Data
US 2015/0325546 A1 Nov. 12, 2015

Related U.S. Application Data

(63) Continuation of application No. 14/465,962, filed on Aug. 22, 2014, now Pat. No. 9,136,167, which is a
(Continued)

(51) Int. Cl.
*H01L 21/768* (2006.01)
*H01L 23/00* (2006.01)

(52) U.S. Cl.
CPC ........ *H01L 21/76885* (2013.01); *H01L 24/03* (2013.01); *H01L 24/05* (2013.01);
(Continued)

(58) Field of Classification Search
CPC ......... H01L 23/00; H01L 23/50; H01L 24/16; H01L 24/13; H01L 24/03; H01L 24/11; H01L 24/81; H01L 24/05; H01L 21/76885
(Continued)

(56) References Cited

U.S. PATENT DOCUMENTS

| 3,528,090 A | 9/1970 | Van Laer |
| 4,380,867 A | 4/1983 | Antson |

(Continued)

FOREIGN PATENT DOCUMENTS

| CN | 1437256 | 8/2008 |
| CN | 101404269 | 4/2009 |

(Continued)

OTHER PUBLICATIONS

U.S. Appl. No. 61/230,012, filed Jul. 30, 2009, Chung-Shi Liu.
(Continued)

*Primary Examiner* — Sheng-Bai Zhu
(74) *Attorney, Agent, or Firm* — Hauptman Ham, LLP

(57) ABSTRACT

An integrated circuit device includes a semiconductor substrate; and a pad region over the semiconductor substrate. The integrated circuit device further includes an under-bump-metallurgy (UBM) layer over the pad region. The integrated circuit device further includes a conductive pillar on the UBM layer, wherein the conductive pillar has a sidewall surface and a top surface. The integrated circuit device further includes a protection structure over the sidewall surface of the conductive pillar, wherein sidewalls of the UBM layer are substantially free of the protection structure, and the protection structure is a non-metal material.

20 Claims, 12 Drawing Sheets

Related U.S. Application Data continuation of application No. 12/730,411, filed on Mar. 24, 2010, now Pat. No. 8,841,766.

(52) U.S. Cl.
CPC .............. *H01L 24/11* (2013.01); *H01L 24/13* (2013.01); *H01L 24/16* (2013.01); *H01L 24/81* (2013.01); *H01L 2224/023* (2013.01); *H01L 2224/0345* (2013.01); *H01L 2224/0361* (2013.01); *H01L 2224/03614* (2013.01); *H01L 2224/03901* (2013.01); *H01L 2224/03912* (2013.01); *H01L 2224/0401* (2013.01); *H01L 2224/05016* (2013.01); *H01L 2224/05024* (2013.01); *H01L 2224/0569* (2013.01); *H01L 2224/05073* (2013.01); *H01L 2224/05166* (2013.01); *H01L 2224/05181* (2013.01); *H01L 2224/05187* (2013.01); *H01L 2224/05578* (2013.01); *H01L 2224/05647* (2013.01); *H01L 2224/10126* (2013.01); *H01L 2224/1132* (2013.01); *H01L 2224/1145* (2013.01); *H01L 2224/1146* (2013.01); *H01L 2224/1147* (2013.01); *H01L 2224/1182* (2013.01); *H01L 2224/11452* (2013.01); *H01L 2224/11462* (2013.01); *H01L 2224/11464* (2013.01); *H01L 2224/11614* (2013.01); *H01L 2224/11827* (2013.01); *H01L 2224/11849* (2013.01); *H01L 2224/11901* (2013.01); *H01L 2224/11912* (2013.01); *H01L 2224/1369* (2013.01); *H01L 2224/13099* (2013.01); *H01L 2224/13147* (2013.01); *H01L 2224/13561* (2013.01); *H01L 2224/13562* (2013.01); *H01L 2224/13564* (2013.01); *H01L 2224/13565* (2013.01); *H01L 2224/13582* (2013.01); *H01L 2224/13583* (2013.01); *H01L 2224/13609* (2013.01); *H01L 2224/13611* (2013.01); *H01L 2224/13639* (2013.01); *H01L 2224/13644* (2013.01); *H01L 2224/13647* (2013.01); *H01L 2224/13655* (2013.01); *H01L 2224/13664* (2013.01); *H01L 2224/16238* (2013.01); *H01L 2224/814* (2013.01); *H01L 2224/81024* (2013.01); *H01L 2224/81191* (2013.01); *H01L 2224/81411* (2013.01); *H01L 2224/81413* (2013.01); *H01L 2224/81416* (2013.01); *H01L 2224/81439* (2013.01); *H01L 2224/81447* (2013.01); *H01L 2224/81455* (2013.01); *H01L 2224/81815* (2013.01); *H01L 2924/0103* (2013.01); *H01L 2924/014* (2013.01); *H01L 2924/0104* (2013.01); *H01L 2924/01005* (2013.01); *H01L 2924/0105* (2013.01); *H01L 2924/01006* (2013.01); *H01L 2924/01007* (2013.01); *H01L 2924/01012* (2013.01); *H01L 2924/01013* (2013.01); *H01L 2924/01014* (2013.01); *H01L 2924/01015* (2013.01); *H01L 2924/01019* (2013.01); *H01L 2924/01023* (2013.01); *H01L 2924/01024* (2013.01); *H01L 2924/01025* (2013.01); *H01L 2924/01029* (2013.01); *H01L 2924/01032* (2013.01); *H01L 2924/01033* (2013.01); *H01L 2924/01038* (2013.01); *H01L 2924/01047* (2013.01); *H01L 2924/01049* (2013.01); *H01L 2924/01073* (2013.01); *H01L 2924/01075* (2013.01); *H01L 2924/01078* (2013.01); *H01L 2924/01079* (2013.01); *H01L 2924/01082* (2013.01); *H01L 2924/01322* (2013.01); *H01L 2924/04941* (2013.01); *H01L 2924/04953* (2013.01); *H01L 2924/1305* (2013.01); *H01L 2924/13091* (2013.01); *H01L 2924/14* (2013.01); *H01L 2924/206* (2013.01); *H01L 2924/2064* (2013.01); *H01L 2924/20641* (2013.01); *H01L 2924/20642* (2013.01)

(58) Field of Classification Search
USPC ................................ 257/737, 774, 750–752
See application file for complete search history.

(56) References Cited

U.S. PATENT DOCUMENTS

| | | |
|---|---|---|
| 4,720,740 A | 1/1988 | Clements |
| 4,811,082 A | 3/1989 | Jacobs et al. |
| 4,990,462 A | 2/1991 | Sliwa, Jr. |
| 5,027,188 A | 6/1991 | Owada et al. |
| 5,075,253 A | 12/1991 | Sliwa, Jr. |
| 5,134,460 A | 7/1992 | Brady et al. |
| 5,380,681 A | 1/1995 | Hsu |
| 5,391,917 A | 2/1995 | Gilmour et al. |
| 5,466,635 A | 11/1995 | Lynch et al. |
| 5,510,298 A | 4/1996 | Redwine |
| 5,757,881 A | 5/1998 | Hosomi et al. |
| 5,767,001 A | 6/1998 | Bertagnolli et al. |
| 5,841,133 A | 11/1998 | Omi |
| 5,998,292 A | 12/1999 | Black et al. |
| 6,002,177 A | 12/1999 | Gaynes et al. |
| 6,015,749 A | 1/2000 | Liu et al. |
| 6,130,162 A * | 10/2000 | Liu ................... H01L 21/76841 257/E21.584 |
| 6,184,060 B1 | 2/2001 | Siniaguine |
| 6,187,678 B1 | 2/2001 | Gaynes et al. |
| 6,191,493 B1 * | 2/2001 | Yasunaga et al. ............ 257/787 |
| 6,218,281 B1 | 4/2001 | Watanabe et al. |
| 6,229,216 B1 | 5/2001 | Ma et al. |
| 6,229,220 B1 | 5/2001 | Saitoh et al. |
| 6,232,563 B1 | 5/2001 | Kim et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,291,891 B1 * | 9/2001 | Higashi et al. ............... 257/774 |
| 6,322,903 B1 | 11/2001 | Siniaguine et al. |
| 6,339,029 B1 | 1/2002 | Yu et al. |
| 6,355,501 B1 | 3/2002 | Fung et al. |
| 6,372,859 B1 | 4/2002 | Sakata et al. |
| 6,426,556 B1 | 7/2002 | Lin |
| 6,434,016 B2 | 8/2002 | Zeng et al. |
| 6,448,168 B1 | 9/2002 | Rao et al. |
| 6,448,661 B1 | 9/2002 | Kim et al. |
| 6,464,895 B2 | 10/2002 | Forat et al. |
| 6,465,892 B1 | 10/2002 | Suga |
| 6,472,293 B1 | 10/2002 | Suga |
| 6,492,198 B2 | 12/2002 | Hwang |
| 6,538,333 B2 | 3/2003 | Kong |
| 6,562,653 B1 | 5/2003 | Ma et al. |
| 6,570,248 B1 | 5/2003 | Ahn et al. |
| 6,576,381 B1 | 6/2003 | Hirano et al. |
| 6,578,754 B1 | 6/2003 | Tung |
| 6,592,019 B2 | 7/2003 | Tung |
| 6,599,778 B2 | 7/2003 | Pogge et al. |
| 6,600,222 B1 | 7/2003 | Levardo |
| 6,607,938 B2 | 8/2003 | Kwon et al. |
| 6,639,303 B2 | 10/2003 | Siniaguine |
| 6,661,085 B2 | 12/2003 | Kellar et al. |
| 6,664,129 B2 | 12/2003 | Siniaguine |
| 6,693,361 B1 | 2/2004 | Siniaguine et al. |
| 6,731,003 B2 | 5/2004 | Joshi et al. |
| 6,740,582 B2 | 5/2004 | Siniaguine |
| 6,762,076 B2 | 7/2004 | Kim et al. |
| 6,770,958 B2 | 8/2004 | Wang et al. |
| 6,790,748 B2 | 9/2004 | Kim et al. |
| 6,800,930 B2 | 10/2004 | Jackson et al. |
| 6,818,545 B2 | 11/2004 | Lee et al. |
| 6,828,677 B2 | 12/2004 | Yap et al. |
| 6,841,883 B1 | 1/2005 | Farnworth et al. |
| 6,853,076 B2 * | 2/2005 | Datta ................... H01L 23/49816 257/738 |

(56) References Cited

U.S. PATENT DOCUMENTS

| | | |
|---|---|---|
| 6,869,831 B2 | 3/2005 | Cowens et al. |
| 6,879,041 B2 | 4/2005 | Yamamoto et al. |
| 6,882,030 B2 | 4/2005 | Siniaguine |
| 6,887,769 B2 | 5/2005 | Kellar et al. |
| 6,897,532 B1* | 5/2005 | Schwarz ............... B82Y 25/00 257/367 |
| 6,908,565 B2 | 6/2005 | Kim et al. |
| 6,908,785 B2 | 6/2005 | Kim |
| 6,917,119 B2 | 7/2005 | Lee et al. |
| 6,924,551 B2 | 8/2005 | Rumer et al. |
| 6,943,067 B2 | 9/2005 | Greenlaw |
| 6,946,384 B2 | 9/2005 | Kloster et al. |
| 6,958,539 B2 | 10/2005 | Lay et al. |
| 6,962,867 B2 | 11/2005 | Jackson et al. |
| 6,962,872 B2 | 11/2005 | Chudzik et al. |
| 6,975,016 B2 | 12/2005 | Kellar et al. |
| 7,008,867 B2 | 3/2006 | Lei |
| 7,012,333 B2 | 3/2006 | Shimoyama et al. |
| 7,030,481 B2 | 4/2006 | Chudizk et al. |
| 7,037,804 B2 | 5/2006 | Kellar et al. |
| 7,049,170 B2 | 5/2006 | Savastiouk et al. |
| 7,056,807 B2 | 6/2006 | Kellar et al. |
| 7,060,601 B2 | 6/2006 | Savastiouk et al. |
| 7,064,436 B2 | 6/2006 | Ishiguri et al. |
| 7,071,546 B2 | 7/2006 | Fey et al. |
| 7,087,538 B2 | 8/2006 | Staines et al. |
| 7,111,149 B2 | 9/2006 | Eilert |
| 7,122,912 B2 | 10/2006 | Matsui |
| 7,151,009 B2 | 12/2006 | Kim et al. |
| 7,157,787 B2 | 1/2007 | Kim et al. |
| 7,193,308 B2 | 3/2007 | Matsui |
| 7,215,033 B2 | 5/2007 | Lee et al. |
| 7,262,495 B2 | 8/2007 | Chen et al. |
| 7,271,497 B2 | 9/2007 | Joshi et al. |
| 7,276,799 B2 | 10/2007 | Lee et al. |
| 7,279,795 B2 | 10/2007 | Periaman et al. |
| 7,297,574 B2 | 11/2007 | Thomas et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,335,972 B2 | 2/2008 | Chanchani |
| 7,345,350 B2 | 3/2008 | Sinha |
| 7,348,210 B2 | 3/2008 | Daubenspeck et al. |
| 7,355,273 B2 | 4/2008 | Jackson et al. |
| 7,391,112 B2 | 6/2008 | Li et al. |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,462,942 B2 | 12/2008 | Tan et al. |
| 7,494,845 B2 | 2/2009 | Hwang et al. |
| 7,501,311 B2 | 3/2009 | Tsai |
| 7,528,494 B2 | 5/2009 | Furukawa et al. |
| 7,531,890 B2 | 5/2009 | Kim |
| 7,557,597 B2 | 7/2009 | Anderson et al. |
| 7,566,650 B2 | 7/2009 | Lin et al. |
| 7,576,435 B2 | 8/2009 | Chao |
| 7,592,246 B2 | 9/2009 | Akram |
| 7,648,899 B1 | 1/2010 | Banerji et al. |
| 7,700,475 B1 | 4/2010 | Kao et al. |
| 7,825,511 B2 | 11/2010 | Daubenspeck et al. |
| 7,834,450 B2 | 11/2010 | Kang |
| 7,928,534 B2 | 4/2011 | Hsu et al. |
| 7,973,418 B2 | 7/2011 | Alvarado et al. |
| 8,097,827 B2 | 1/2012 | Marion |
| 8,227,926 B2 | 7/2012 | Topacio et al. |
| 8,242,610 B2 | 8/2012 | Yamaguchi et al. |
| 8,309,451 B2 | 11/2012 | Do et al. |
| 8,841,766 B2 | 9/2014 | Hwang et al. |
| 2001/0000321 A1 | 4/2001 | Takeda et al. |
| 2002/0014705 A1 | 2/2002 | Ishio et al. |
| 2003/0156969 A1 | 8/2003 | Choi et al. |
| 2003/0216025 A1 | 11/2003 | Lu et al. |
| 2004/0094842 A1 | 5/2004 | Jimarez et al. |
| 2004/0166661 A1 | 8/2004 | Lei |
| 2005/0001324 A1 | 1/2005 | Dunn et al. |
| 2005/0012211 A1* | 1/2005 | Kung et al. ................. 257/734 |
| 2005/0077624 A1 | 4/2005 | Tan et al. |
| 2005/0098888 A1 | 5/2005 | Akram |
| 2005/0179131 A1 | 8/2005 | Homma |
| 2006/0043603 A1 | 3/2006 | Ranade et al. |
| 2006/0166402 A1 | 7/2006 | Lim et al. |
| 2006/0237842 A1 | 10/2006 | Shindo |
| 2006/0278982 A1* | 12/2006 | Solo De Zaldivar ... H01L 24/28 257/737 |
| 2007/0023904 A1 | 2/2007 | Salmon |
| 2007/0080451 A1 | 4/2007 | Suh |
| 2007/0108606 A1* | 5/2007 | Watanabe ........... H01L 23/3114 257/734 |
| 2007/0117368 A1* | 5/2007 | Tsai ....................... H01L 24/05 438/612 |
| 2007/0231957 A1* | 10/2007 | Mitsuhashi ......... H01L 21/4853 438/106 |
| 2007/0284684 A1 | 12/2007 | Naito et al. |
| 2007/0284706 A1 | 12/2007 | Cherian |
| 2007/0287279 A1 | 12/2007 | Daubenspeck et al. |
| 2008/0197489 A1 | 8/2008 | Chyi |
| 2008/0296764 A1 | 12/2008 | Chang et al. |
| 2009/0011543 A1 | 1/2009 | Karta et al. |
| 2009/0026608 A1 | 1/2009 | Tsai et al. |
| 2009/0045511 A1 | 2/2009 | Meyer et al. |
| 2009/0096109 A1 | 4/2009 | Iwasaki |
| 2009/0098724 A1 | 4/2009 | Yu |
| 2009/0130840 A1 | 5/2009 | Wang et al. |
| 2009/0149016 A1* | 6/2009 | Park et al. ................. 438/614 |
| 2009/0197114 A1 | 8/2009 | Shih et al. |
| 2009/0229857 A1 | 9/2009 | Fredenberg et al. |
| 2010/0090318 A1 | 4/2010 | Hsu et al. |
| 2010/0109159 A1 | 5/2010 | Ho et al. |
| 2010/0187685 A1 | 7/2010 | Morifuji et al. |
| 2010/0230810 A1 | 9/2010 | Kang et al. |
| 2011/0101523 A1 | 5/2011 | Hwang et al. |
| 2011/0101526 A1 | 5/2011 | Hsiao et al. |
| 2011/0156256 A1 | 6/2011 | Kang et al. |
| 2011/0227216 A1 | 9/2011 | Tseng et al. |
| 2011/0281432 A1 | 11/2011 | Farooq et al. |
| 2012/0100682 A1* | 4/2012 | Munetaka ......... H01L 29/42356 438/270 |
| 2012/0146212 A1* | 6/2012 | Daubenspeck ......... H01L 24/03 257/737 |
| 2015/0279776 A1* | 10/2015 | Hu .................... H01L 23/49861 257/668 |

FOREIGN PATENT DOCUMENTS

| | | |
|---|---|---|
| CN | 101582386 | 11/2009 |
| JP | 05-335313 | 12/1993 |
| JP | 2000-228420 | 8/2000 |
| TW | 200744142 | 3/2007 |

OTHER PUBLICATIONS

U.S. Appl. No. 61/238,749, filed Sep. 1, 2009, Chung-Shi Liu.
U.S. Appl. No. 61/258,393, filed Nov. 5, 2009, Chien Ling Hwang et al.
Kim, K. S., et al., "The Interface Formation and Adhesion of Metals (Cu, Ta, and Ti) and Low Dielectric Constant Polymer-Like Organic Thin Films Deposited by Plasma-Enhanced Chemical Vapor Deposition Using Para-Xylene Precursor", Thin Solid Films 377-378 (2000), pp. 122-128.
Kim, K. J., et al., "Chemical Interaction, Adhesion and Diffusion Properties at the Interface of Cu and Plasma-Treated Thiophene-Based Plasma Polymer (ThioPP) Films", Thin Solid Films 398-399 (2001), pp. 657-662.
Du, M., et al., "The Interface Formation of Copper and Low Dielectric Constant Fluoro-Polymer: Plasma Surface Modification and its Effect on Copper Diffusion", Journal of Applied Physics, vol. 85, No. 3, Feb. 1, 1999, pp. 1496-1502.
Jiang, Liang-You, et al., "Reduced Copper Diffusion in Layered Silicate/Fluorinated Polyimide (6FDS-ODA) Nanocomposites", Journal of Applied Polymer Science, vol. 92, 1422-1425 (2004).

(56) References Cited

OTHER PUBLICATIONS

Office Action dated May 3, 2012 from corresponding application No. CN 201010257039.3.
Office Action dated Mar. 3, 2013 from corresponding application No. TW 099125728.
U.S. Appl. No. 61/258,414, filed Nov. 5, 2009, Chien Ling Hwang et al.
OA dated Jul. 27, 2017 from corresponding application No. CN 201510711114.1.

* cited by examiner

METHOD OF MAKING A PILLAR STRUCTURE HAVING A NON-METAL SIDEWALL PROTECTION STRUCTURE AND INTEGRATED CIRCUIT INCLUDING THE SAME

PRIORITY CLAIM

The present application is a continuation of U.S. application Ser. No. 14/465,962, filed Aug. 22, 2014, which is a continuation of U.S. application Ser. No. 12/730,411, filed Mar. 24, 2010, now U.S. Pat. No. 8,841,766, issued Sep. 23, 2014, which are incorporated herein by reference in their entireties.

RELATED APPLICATIONS

The present application is related to U.S. provisional No. 61/230,012 filed on Jul. 30, 2009, U.S. provisional No. 61/238,749 filed on Sep. 1, 2009, U.S. provisional No. 61/258,393 filed on Nov. 5, 2009, all of which are expressly incorporated by reference herein in their entirety.

TECHNICAL FIELD

This disclosure relates to integrated circuit fabrication, and more particularly, to bump structures in integrated circuit device.

BACKGROUND

Modern integrated circuits are made up of literally millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. An UBM generally contains an adhesion layer, a barrier layer and a wetting layer, arranged in that order, on the I/O pad. The bumps themselves, based on the material used, are classified as solder bumps, gold bumps, copper pillar bumps and bumps with mixed metals. Recently, copper pillar bump technology has been proposed. Instead of using a solder bump, the electronic component is connected to a substrate by means of a copper pillar bump, which achieves finer pitch with minimum probability of bump bridging, reduces the capacitance load for the circuits, and allows the electronic component to perform at higher frequencies.

Cu pillar bump flip-chip assembly has the following advantages: (1) better thermal/electric performance, (2) higher current carrying capacity, (3) better resistance to electromigration, thus longer bump life, (4) minimizing molding voids—more consistence gaps between Cu pillar bumps. Also, a lower cost substrate is possible by using Cu-pillar controlled solder spreading, eliminating lead-free teardrop design. However, copper has a tendency to be oxidized during the manufacturing process. Oxidized copper pillars may lead to poor adhesion of an electronic component to a substrate. The poor adhesion may cause serious reliability concerns due to high leakage currents. Oxidized copper pillars may also lead to underfill cracking along the interface of the underfill and the copper pillars. The cracks may propagate to the underlying low-K dielectric layers or to the solder used to bond the copper pillars to the substrate. A sidewall protection layer is therefore needed to prevent copper oxidation, but the conventional method of processing the Cu pillar sidewall suffers from high process costs and interface delamination issues. Currently, an immersion tin (Sn) process is employed to provide a tin layer on the Cu pillar sidewalls, but there are still concerns regarding process costs, adhesion between Sn and underfill, and issues of solder wetting onto sidewalls, which is a challenge for fine pitch package technology in new generation chips.

BRIEF DESCRIPTION OF THE DRAWINGS

The aforementioned objects, features and advantages of this disclosure will become apparent by referring to the following detailed description of the embodiments with reference to the accompanying drawings, wherein.

DETAILED DESCRIPTION OF ILLUSTRATIVE EMBODIMENTS

Figure 1A:
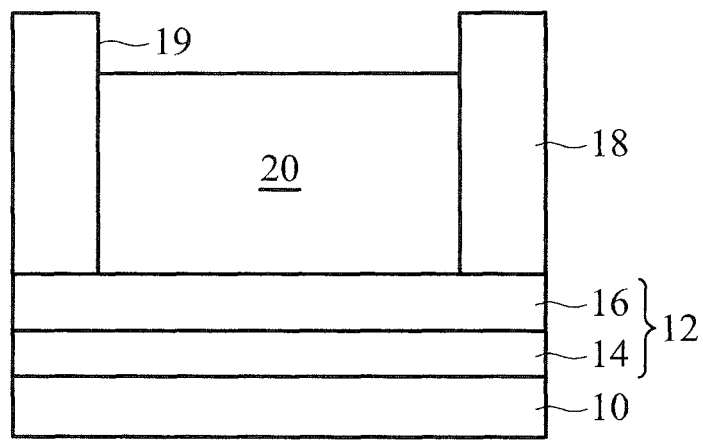
FIGS. 1A-1F are cross-sectional views depicting an exemplary embodiment of a portion of a semiconductor device at stages in a Cu pillar bump process.

This disclosure provides embodiments of sidewall protection processes for Cu pillar bump technology, in which a protection structure on the sidewalls of the Cu pillar bump is formed of at least one of several non-metal material layers, for example a dielectric material layer, a polymer material layer or combinations thereof. As employed throughout this disclosure, the term "Cu pillar bump" refers to a bump structure comprising a conductive pillar (a post or a standoff) formed of copper or copper alloys. The Cu pillar bump may be applied directly on an electrical pad or a redistribution layer on a semiconductor chip for a flip chip assembly or other similar application.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, an apparatus in accordance with the present disclosure. It is to be understood that elements not specifically shown or described may take various forms. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Herein, FIGS. 1A-1F are cross-sectional views depicting an exemplary embodiment of a portion of a semiconductor device at stages in a Cu pillar bump process.

With reference to FIG. 1A, an example of a semiconductor substrate 10 used for bump fabrication is employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The substrate 10 may further comprise a plurality of isolation features (not shown), such as shallow trench isolation (STI) features or local oxidation of silicon (LOCOS) features. The isolation features may define and isolate the various microelectronic elements (not shown). Examples of the various microelectronic elements that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. Various processes are performed to form the various microelectronic elements including deposition, etching, implantation, photolithography, annealing, and other suitable processes. The microelectronic elements are interconnected to form the integrated circuit device, such as a logic device, memory device (e.g., static random access memory or SRAM), radio frequency (RF) device, input/output (I/O) device, system-on-chip (SoC) device, combinations thereof, and other suitable types of devices.

The substrate 10 further includes inter-layer dielectric layers and a metallization structure overlying the integrated circuits. The inter-layer dielectric layers in the metallization structure include low-k dielectric materials, un-doped silicate glass (USG), silicon nitride, silicon oxynitride, or other commonly used materials. The dielectric constants (k value) of the low-k dielectric materials may be less than about 3.9, or less than about 2.8. Metal lines in the metallization structure may be formed of copper or copper alloys. One skilled in the art will realize the formation details of the metallization layers. A pad region (not shown) is a top metallization layer formed in a top-level inter-layer dielectric layer, which is a portion of conductive routes and has an exposed surface treated by a planarization process, such as chemical mechanical polishing (CMP), if necessary. Suitable materials for the pad region may include, but are not limited to, for example copper (Cu), aluminum (Al), AlCu, copper alloy, or other mobile conductive materials. The pad region is used in the bonding process to connect the integrated circuits in the respective chip to external features.

The substrate 10 further includes a passivation layer (not shown) formed overlying and exposing a portion of the pad region for allowing subsequent Cu pillar bump processes. The passivation layer is formed of a non-organic material selected from un-doped silicate glass (USG), silicon nitride, silicon oxynitride, silicon oxide, and combinations thereof. Alternatively, the passivation layer is formed of a polymer layer, such as an epoxy, polyimide, benzocyclobutene (BCB), polybenzoxazole (PBO), and the like, although other relatively soft, often organic, dielectric materials can also be used.

Referring to FIG. 1A, the formation of an under-bump-metallurgy (UBM) layer 12 including a first UBM layer 14 and a second UBM layer 16 is performed on the substrate 10. For example, the UBM layer 12 is formed on the exposed portion of the pad region, and extends to a portion of the passivation layer. The first UBM layer 14, also referred to as a diffusion barrier layer or a glue layer, is formed of titanium, tantalum, titanium nitride, tantalum nitride, or the like by physical vapor deposition (PVD) or sputtering. The first UBM layer 14 is deposited to a thickness of between about 500 and 2000 angstrom, for example, to a thickness of about 1000 Angstrom. The second UBM layer 16 is a copper seed layer formed on the first UBM layer 14 by physical vapor deposition (PVD) or sputtering. The second UBM layer 16 may be formed of copper alloys that include silver, chromium, nickel, tin, gold, and combinations thereof. The second UBM layer 16 is deposited to a thickness of between about 500 and 10000 angstrom, for example, to a thickness of about 5000 Angstrom. In one embodiment, the UBM layer 12 includes a first UBM layer 14 formed of Ti and a second UBM layer 16 formed of Cu.

Next, a mask layer 18 is provided on the UBM layer 12 and patterned with an opening 19 exposing a portion of the UBM layer 12 for Cu pillar bump formation. The mask layer 18 may be a dry film or a photoresist film. The opening 19 is then partially or fully filled with a conductive material with solder wettability. In an embodiment, a copper (Cu) layer 20 is formed in the opening 19 to contact the underlying UBM layer 12. As used throughout this disclosure, the term "copper (Cu) layer" is intended to include substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. For example, electro-chemical plating (ECP) is carried out to form the Cu layer 20. In an exemplary embodiment, the thickness of the Cu layer 20 is greater than 25 µm, also referred to as a Cu pillar 20 having a top surface 20a and sidewall surfaces 20b hereinafter. In another exemplary embodiment, the thickness of the Cu layer is greater than 40 µm. For example, the Cu layer is of about 40-50 µm thickness, or about 40-70 µm thickness, although the thickness may be greater or smaller.

Figure 1B:
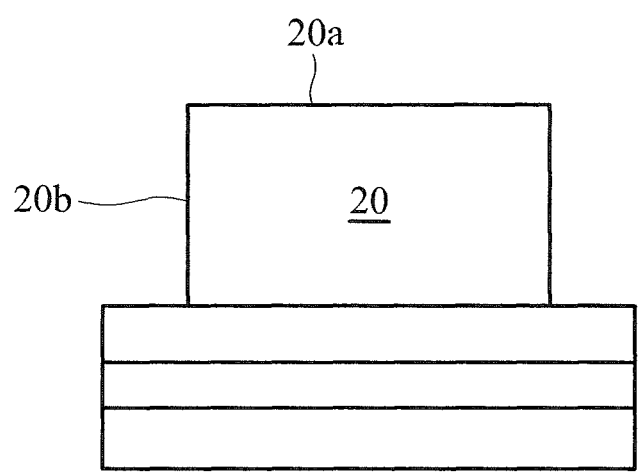
Figure 1C:
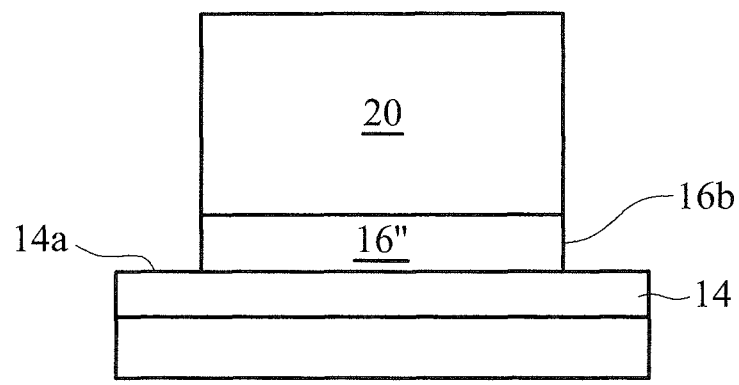

With reference to FIG. 1B, the mask layer 18 is removed, exposing the top surface 20a and sidewall surfaces 20b of the Cu pillar 20 and a portion of the second UBM layer 16 outside the Cu pillar 20. In the case the mask layer 18 is a dry film, it may be removed using an alkaline solution. If the mask layer 18 is formed of photoresist, it may be removed using acetone, n-methyl pyrrolidone (NMP), dimethyl sulfoxide (DMSO), aminoethoxy ethanol, and the like. Then as shown in FIG. 1C, the exposed portion of the second UBM layer 16 is etched to expose a portion 14a of the underlying first UBM layer 14 outside the Cu pillar 20. In an exemplary embodiment, the step of removing the second UBM layer 16 is a dry etching or a wet etching. For example, an isotropic wet etching (often referred to as flash etching due to its short duration) using an ammonia-based acid is employed. Thus, underlying the Cu pillar 20, the patterned second UBM layer 16" has sidewall surfaces 16b. Also, outside the Cu pillar 20, a portion 14a of the first UBM layer 14 is exposed.

Figure 1D:
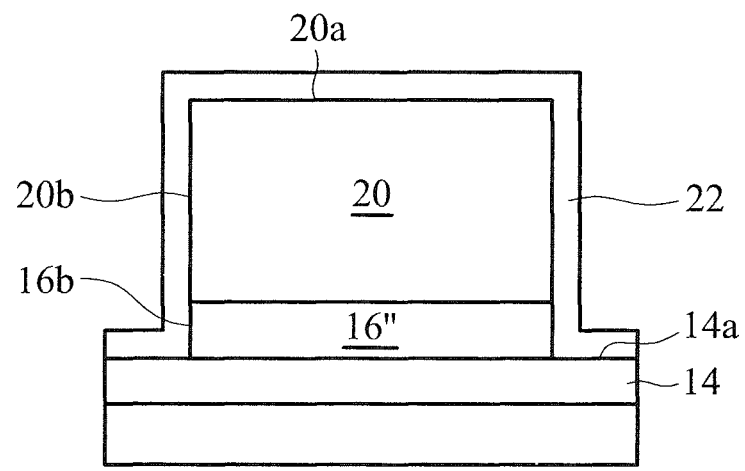

With reference to FIG. 1D, a protection layer 22 is formed on the resulting structure, for example by a blanket deposition. In details, the protection layer 22 is deposited to cover the top surface 20a and the sidewall surfaces 20b of the Cu pillar 20, the sidewall surfaces 16b of the patterned second UBM layer 16" and the exposed portion 14a of the first UBM layer 14. The protection layer 22 is a non-metal material layer, for example a dielectric material layer, a polymer material layer, or combinations thereof. The protection layer 22 may be a single material layer, or a multi-layered structure. The protection layer 22 is between about 500 Angstroms to about 10000 Angstroms thick. In one embodiment, the protection layer 22 is a dielectric material layer formed of silicon nitride, silicon oxide, silicon oxynitride, silicon carbide, alternating layers of silicon oxide and silicon nitride, or combinations thereof by using any of a variety of deposition techniques, including thermal oxidation, LPCVD (low-pressure chemical vapor deposition), APCVD (atmospheric-pressure chemical vapor deposition), or PECVD (plasma-enhanced chemical vapor deposition). In one embodiment, the protection layer 22 is a polymer material layer and is formed of a polymer, such as an epoxy, polyimide, benzocyclobutene (BCB), polybenzoxazole (PBO), and the like, although other relatively soft, often organic, dielectric materials can also be used. The polymer material layer is soft, and hence has the function of reducing inherent stresses on respective portions of the substrate. In addition, the polymer layer is easily formed to a thickness of tens of microns.

Figure 1E:
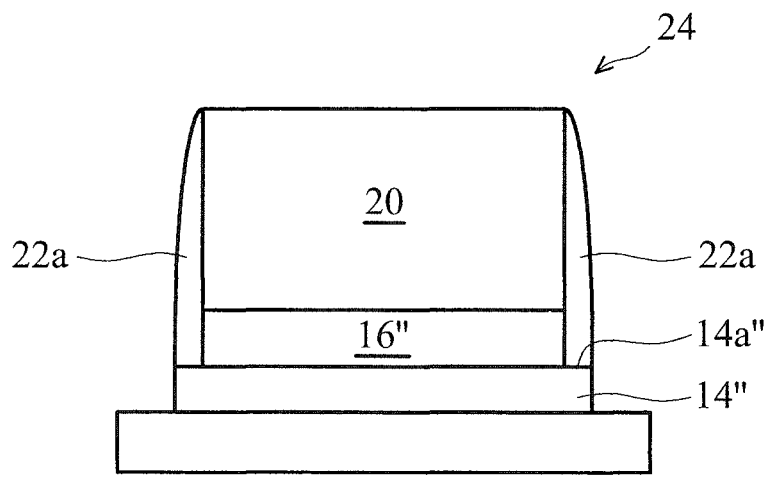

Next, referring to FIG. 1E, certain regions of the protection layer 22 are etched to leave the portion along the sidewall surfaces 20b and 16b and the exposed portion 14a, forming a sidewall spacer 22a, also referred to as a sidewall protection structure 22a, in which the protection layer 22 overlying the top surface 20a of the Cu pillar 20 is removed at this step. Advances in lithography and masking techniques and dry etch processes, such as RIE (Reactive Ion Etching) and other plasma etching processes, allow production of the sidewall spacer 22a.

The first UBM layer 14 is then etched using the created structure 22a as the mask, exposing the underlying substrate 10. A dry etching process, such as standard RIE procedures, using $Cl_2/BCl_3$ as an etchant, is used to etch the first UBM layer 14. Therefore, the dry etching process patterns the exposed portion 14a as a peripheral surface 14a" covered by the sidewall spacer 22a, and exposes sidewall surfaces 14b. Since the peripheral surface 14a extends outside the sidewall surface 16b of the patterned second UBM layer 16", the area of the patterned first UBM layer 14" is greater than the area of the patterned second UBM layer 16".

The completed bump structure 24 includes the Cu pillar 20, the patterned second UBM layer 16" underlying the Cu pillar 20, the patterned first UBM layer 14" underlying the patterned second UBM layer 16", and the sidewall protection structure 22a covering the sidewall surfaces 20b and 16b and the peripheral surface 14a. The substrate 10 is then sawed and packaged onto a package substrate, or another die, with solder balls or Cu bumps mounted on a pad on the package substrate or the other die.

Figure 1F:
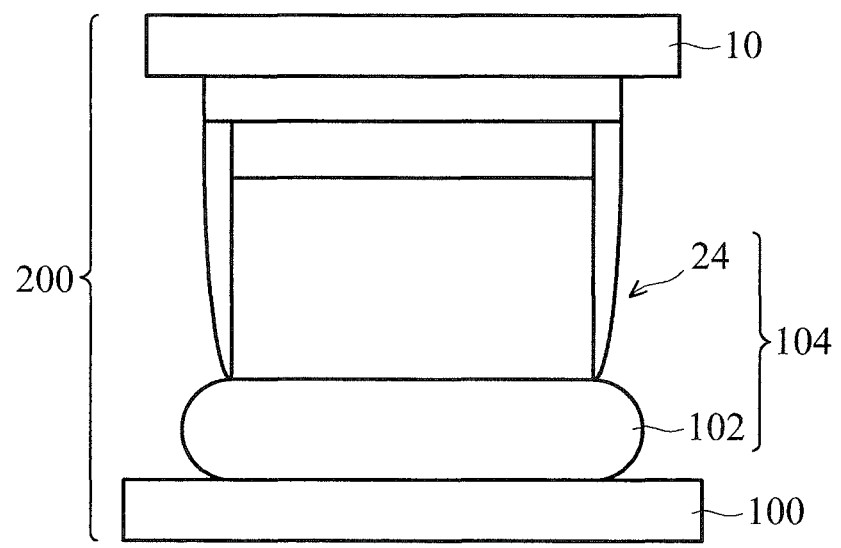

FIG. 1F is a cross-sectional diagram depicting an exemplary embodiment of a flip-chip assembly. The structure shown in FIG. 1E is flipped upside down and attached to another substrate 100 at the bottom. The substrate 100 may be a package substrate, board (e.g., a print circuit board (PCB)), or other suitable substrate. The bump structure 24 contacts the substrate 100 at various conductive attachment points, for example, a joint solder layer 102 on contact pads and/or conductive traces, forming a joint structure 104 coupling the two substrates 10 and 100. The joint solder layer 102 may be a eutectic solder material including alloys of tin, lead, silver, copper, nickel, bismuth, or combinations thereof. An exemplary coupling process includes a flux application, chip placement, reflowing of melting solder joints, and cleaning of flux residue. The integrated circuit substrate 10, the joint structure 104, and the other substrate 100 may be referred to as a packaging assembly 200, or in the present embodiment, a flip-chip packaging assembly.

The disclosure provides a sidewall protection structure formed of a non-metal material on the Cu pillar sidewall to prevent the Cu pillar sidewall from oxidation and increase adhesion between the Cu pillar sidewall and a subsequently formed underfill material. Compared with the conventional immersion Sn method followed by an annealing process, the non-metal sidewall protection structure can adjust substrate stress, and prevent solder wetting to the Cu pillar around the perimeter of the UBM layer during the reflow process. This is applicable to fine pitch bump schemes.

FIGS. 2A-2D are cross-sectional views depicting another exemplary embodiment of a portion of a semiconductor device at stages in a Cu pillar bump process, while explanation of the same or similar portions to the description in FIGS. 1A to 1F will be omitted.

Figure 2A:
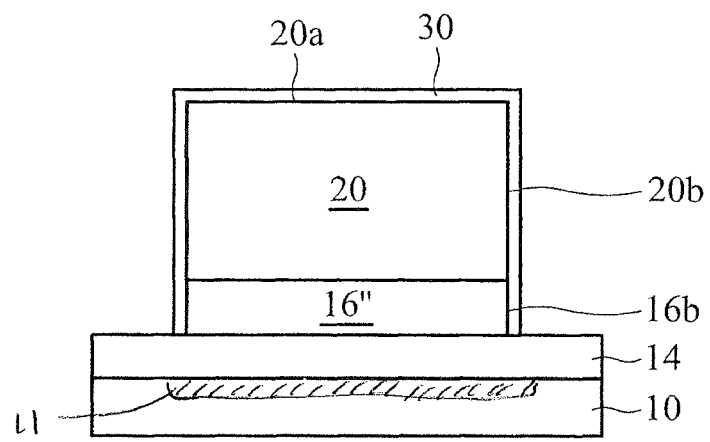
FIGS. 2A-2D are cross-sectional views depicting an exemplary embodiment of a portion of a semiconductor device at stages in a Cu pillar bump process.

With reference to FIG. 2A, after forming the patterned second UBM layer 16" underlying the Cu pillar 20, a barrier layer 30 is formed on the resulted structure. In one embodiment, the barrier layer 30 covers the top surface 20a and the sidewall surfaces 20b of the Cu pillar 20, and the sidewall surfaces 16b of the patterned second UBM layer 16". In other embodiments, the barrier layer 30 covers at least one of the top surface 20a of the Cu pillar 20, the sidewall surfaces 20b of the Cu pillar 20, or the sidewall surfaces 16b of the patterned second UBM layer 16". The barrier layer 30 acts as a diffusion barrier layer for preventing copper in the Cu pillar 20 from diffusing into bonding material, such as solder, that is used to bond the substrate 10 to external features. The barrier layer 30 may be also referred to a protection layer, an antioxidation layer or an oxide resistant layer employed for preventing the surfaces 20a and 20b of the Cu pillar 20 from oxidation during subsequent processes. The barrier layer 30 may be formed through depleting surfaces by selective thermal CVD method. The barrier layer 30 is a copper-containing material layer including a group III element, a group IV element, a group V element listed in the periodic table or any combination thereof. In one embodiment, the copper-containing material layer may include, but is not limited to, boron (B), germanium (Ge), silicon (Si), carbon (C), nitrogen (N), phosphorous (P) or combinations thereof. In some embodiments, the copper-containing material layer is a CuGeN layer, a CuGe layer, a CuSi layer, a CuSiN layer, a CuSiGeN layer, a CuN layer, a CuP layer, a CuC layer, a CuB layer, or combinations thereof, using a selective CVD with gases containing B, Ge, Si, C, N, P or combinations thereof (e.g., $B_2H_6$, $CH_4$, $SiH_4$, $GeH_4$, $NH_3$, PH₃). For an example of forming a CuGeN layer, a deoxidization treatment step (NH₃ treatment) is performed followed by a GeH₄ CVD process. The barrier layer 30 becomes a diffusion barrier layer to passivate the Cu from the solder in subsequent joint processes so that the IMC formation is controlled to become thinner and more uniform. The thickness of the barrier layer 30 is thin, because its formation is like a diffusion process. In one embodiment, the thickness of the barrier layer 30 is less than or equal to 10 nm.

Figure 2B:
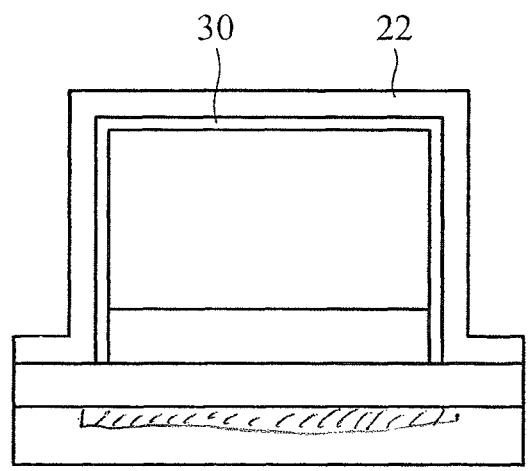

With reference to FIG. 2B, a protection layer 22 is formed on the barrier layer 30 and the exposed portion of the first UBM layer 14, for example by a blanket deposition. The protection layer 22 is a non-metal material layer, for example a dielectric material layer, a polymer material layer or combinations thereof. The protection layer 22 may be a single material layer, or a multi-layered structure. In one embodiment, the protection layer 22 is a dielectric material layer formed of silicon nitride, silicon oxide, silicon oxynitride, silicon carbide, alternating layers of silicon oxide and silicon nitride, or combinations thereof. In one embodiment, the protection layer 22 is a polymer material layer and is formed of a polymer, such as an epoxy, polyimide, benzocyclobutene (BCB), polybenzoxazole (PBO), and the like.

Figure 2C:
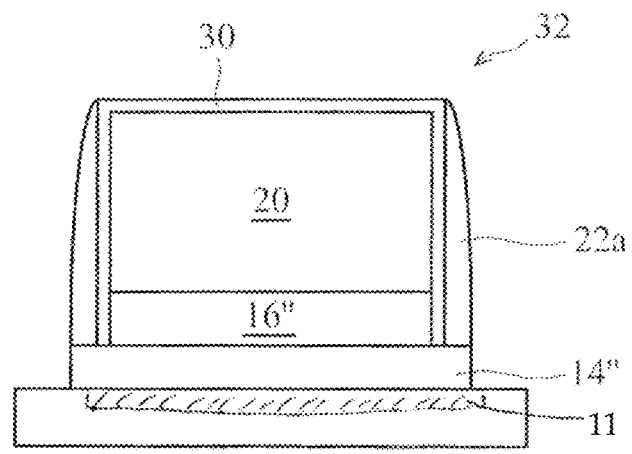

Next, referring to FIG. 2C, certain regions of the protection layer 22 are etched to leave the portion along the sidewall surfaces 20b and 16b, forming a sidewall spacer 22a, also referred to as a sidewall protection structure 22a, in which the protection layer 22 overlying the top surface 20a of the Cu pillar 20 is removed at this step. The barrier layer 30 may remain on the top surface 20a of the Cu pillar at this step. The first UBM layer 14 is then etched using the created structure 22a as the mask, exposing the underlying substrate 10. The completed bump structure 32 includes the Cu pillar 20, the patterned second UBM layer 16" underlying the Cu pillar 20, the patterned first UBM layer 14" underlying the patterned second UBM layer 16" and having the peripheral surface 14a extending outside the sidewall surface 16b, the sidewall protection structure 22a covering the sidewall surfaces 20b and 16b and the peripheral surface 14a, and the barrier layer 30 covering the sidewall protection structure 22a and the top surface 20a of the Cu pillar 20.

Figure 2D:
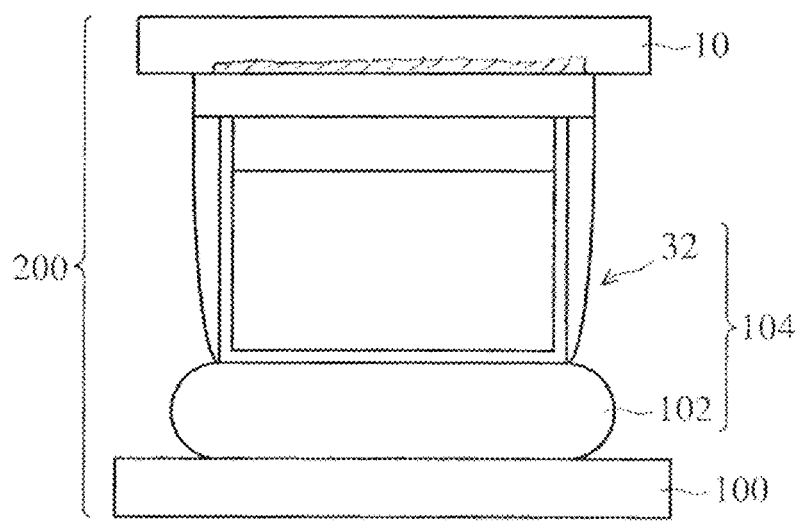

Referring to FIG. 2D, the substrate 10 is flipped upside down and attached to another substrate 100 at the bottom. The bump structure 32 contacts the substrate 100 at various conductive attachment points, for example, a joint solder layer 102 on contact pads and/or conductive traces, forming a joint structure 104 coupling the two substrates 10 and 100. The joint solder layer 102 may be a eutectic solder material including alloys of tin, lead, silver, copper, nickel, bismuth, or combinations thereof. The integrated circuit substrate 10, the joint structure 104, and the other substrate 100 may be referred to as a packaging assembly 200, or in the present embodiment, a flip-chip packaging assembly.

The disclosure provides a barrier layer containing copper and germanium formed between a sidewall protection structure and he Cu pillar sidewall, which can further prevent the Cu pillar sidewall from oxidation and increase adhesion between the Cu pillar sidewall and a subsequently formed underfill material. This prevents solder wetting to the Cu pillar around the perimeter of the UBM layer during the reflow process. The barrier layer will not compromise Rs much.

FIGS. 3A-3F are cross-sectional views depicting another exemplary embodiment of a portion of a semiconductor device at stages in a Cu pillar bump process, while explanation of the same or similar portions to the description in FIGS. 1A to 1F will be omitted.

Figure 3A:
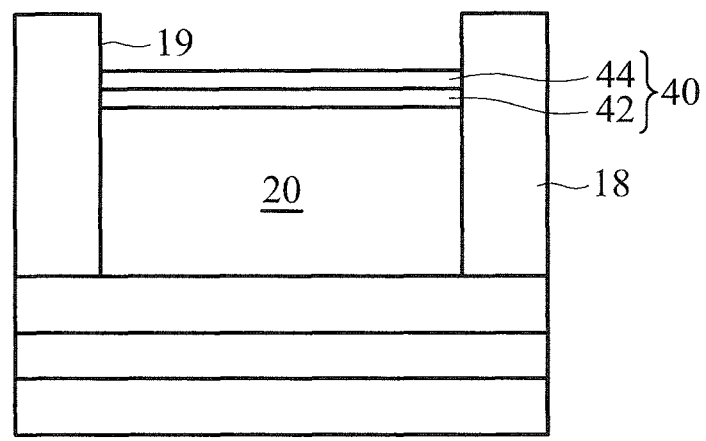
FIGS. 3A-3F are cross-sectional views depicting an exemplary embodiment of a portion of a semiconductor device at stages in a Cu pillar bump process.

With reference to FIG. 3A, after forming the Cu layer 20 in the opening 19 of the mask layer 18, a cap layer 40 is formed on the top surface 20a of the Cu layer 20. The cap layer 40 could act as a barrier layer to prevent copper in the Cu pillar from diffusing into bonding material, such as solder alloy, that is used to bond the substrate 10 to external features. The prevention of copper diffusion increases the reliability and bonding strength of the package. The cap layer 40 may include nickel (Ni), tin, tin-lead (SnPb), gold (Au), silver, palladium (Pd), indium (In), nickel-palladium-gold (NiPdAu), nickel-gold (NiAu), other similar materials, or alloy by plating methods. The cap layer 40 has a thickness about 1-10 μm. In some embodiments, the cap layer 40 is a multi-layer structure including a first metal film 42 and a second metal film 44. The first metal film 42 may include Ni, Au, Pd, Ni-base alloy, Au-base alloy, or Pd-base alloy. The second metal film 44 may include Ni, Au, Pd, Ni-base alloy, Au-base alloy, or Pd-base alloy. In one embodiment, the first metal film 42 is a Ni film, and the second metal film 44 is an Au film. Each of the first metal film 42 and the second metal film 44 has a thickness about 1-5 μm.

Figure 3B:
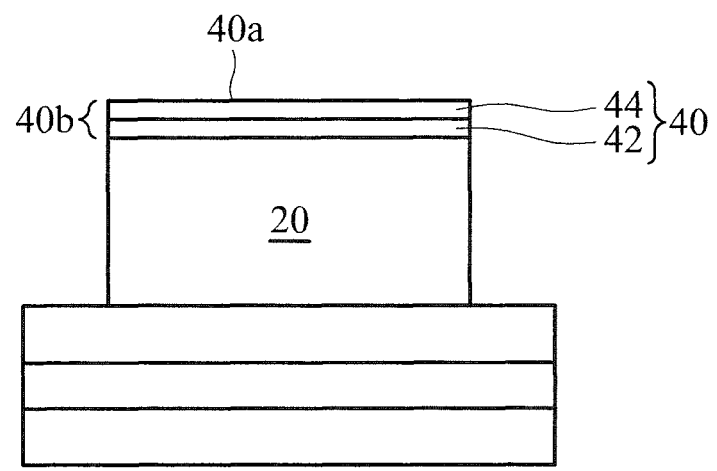
Figure 3C:
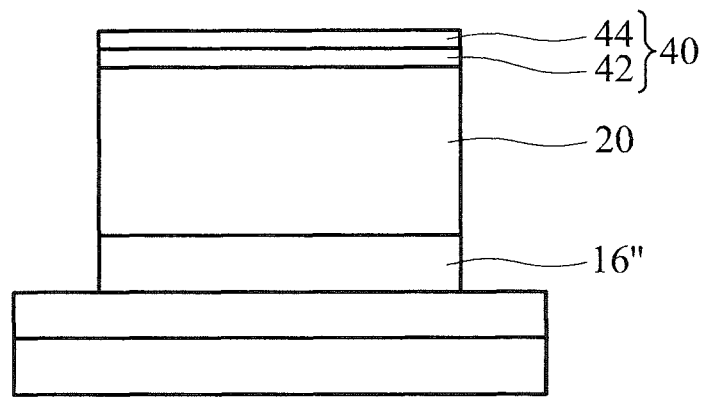
Figure 3D:
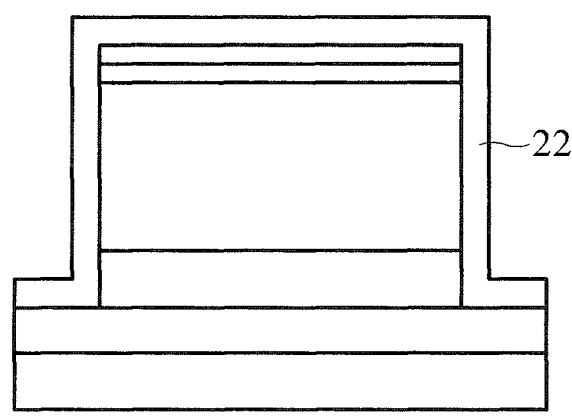
Figure 3E:
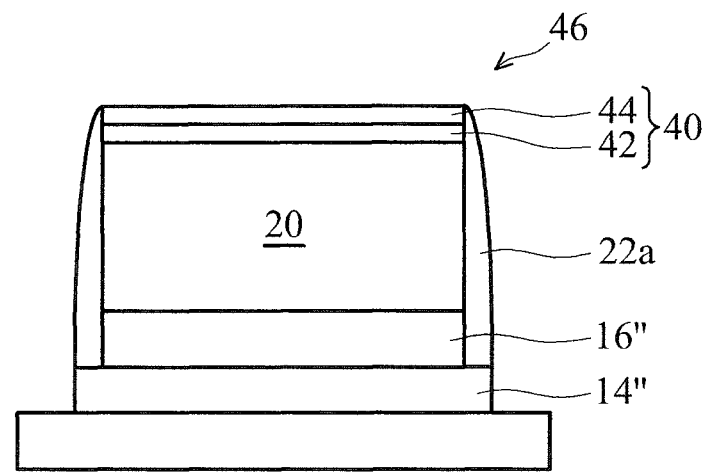

Next, as shown in FIG. 3B, the mask layer 18 is removed, and the top surface 40a and the sidewall surfaces 40b of the cap layer 40 are exposed. Then the exposed portion of the second UBM layer 16 is etched as shown in FIG. 3C, exposing the underlying first UBM layer 14 outside the Cu pillar 20. Thereafter, as depicted in FIG. 3D, a protection layer 22 is formed on the resulted structure, to cover the cap layer 40, the sidewall surfaces 20b of the Cu pillar 20, the sidewall surfaces 16b of the patterned second UBM layer 16" and the exposed portion of the first UBM layer 14. After performing lithography and masking techniques and dry etch processes, a sidewall protection structure 22a is created. The top surface 40a of the cap layer 40 is therefore exposed. The first UBM layer 14 is then etched using the created structure 22a as the mask, exposing the underlying substrate 10.

The completed bump structure 46 includes the Cu pillar 20, the cap layer 40 on the top surface 20a of the Cu pillar 20, the patterned second UBM layer 16" underlying the Cu pillar 20, the patterned first UBM layer 14" underlying the patterned second UBM layer 16" and having the peripheral surface 14a extending outside the sidewall surface 16b of the patterned second UBM layer 16", and the sidewall protection structure 22a covering the sidewall surfaces 40b, 20b and 16b and the peripheral surface 14a. The substrate 10 is then sawed and packaged onto a package substrate, or another die, with solder balls or Cu bumps mounted on a pad on the package substrate or the other die.

Figure 3F:
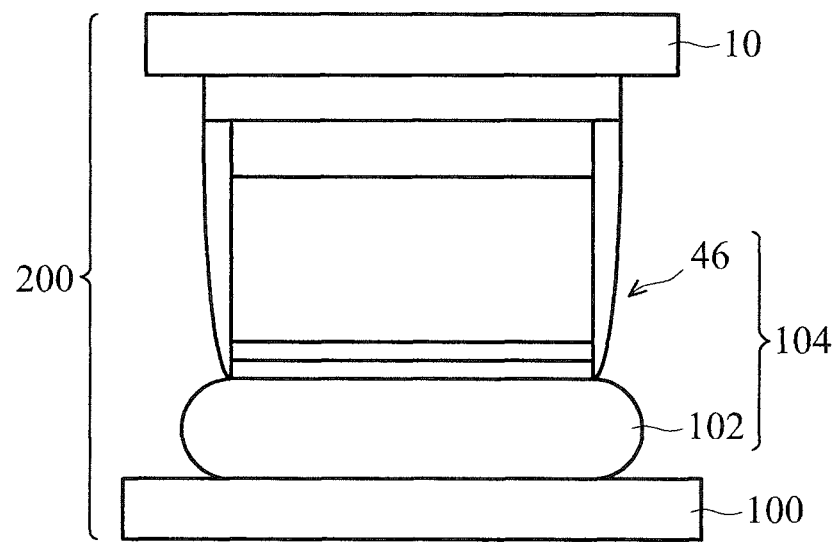

Referring to FIG. 3F, the substrate 10 is flipped upside down and attached to another substrate 100 at the bottom. The bump structure 46 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 200, or in the present embodiment, a flip-chip packaging assembly.

FIGS. 4A-4G are cross-sectional views depicting another exemplary embodiment of a portion of a semiconductor device at stages in a Cu pillar bump process, while explanation of the same or similar portions to the description in FIGS. 3A to 3F will be omitted.

Figure 4A:
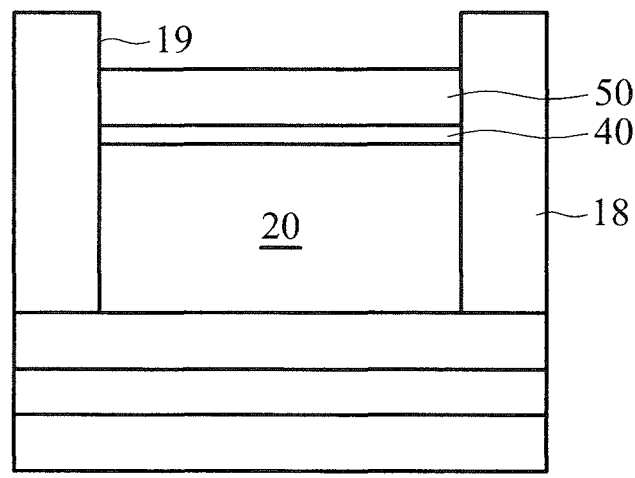
FIGS. 4A-4G are cross-sectional views depicting an exemplary embodiment of a portion of a semiconductor device at stages in a Cu pillar bump process.

With reference to FIG. 4A, after forming the Cu layer 20 in the opening 19 of the mask layer 18, a cap layer 40 is formed on the top surface 20a of the Cu layer 20, and then a solder layer 50 is formed on the top surface 40a of the cap layer 40. The solder layer 50 may be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. In one embodiment, the solder layer 50 is a lead-free solder layer. For a lead-free solder system, the solder layer is SnAg with Ag content being controlled lower than 3.0 weight percent (wt %). For example, the lead-free solder layer is SnAg with Ag content being controlled at about 2.5 weight percent (wt %).

Figure 4B:
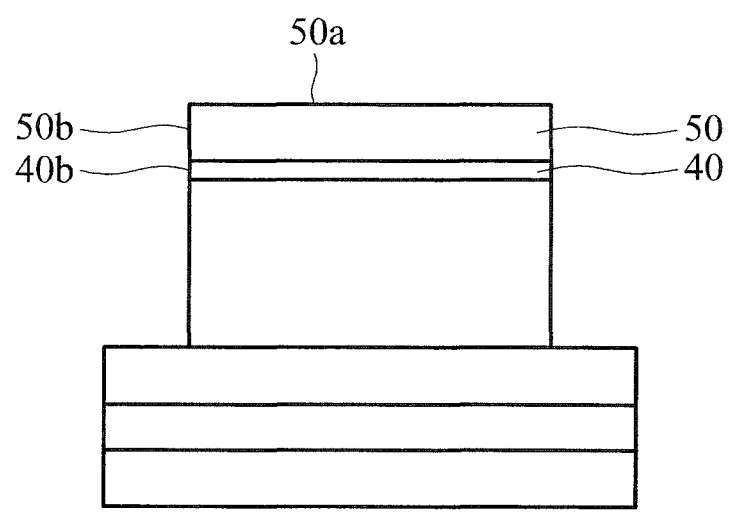
Figure 4C:
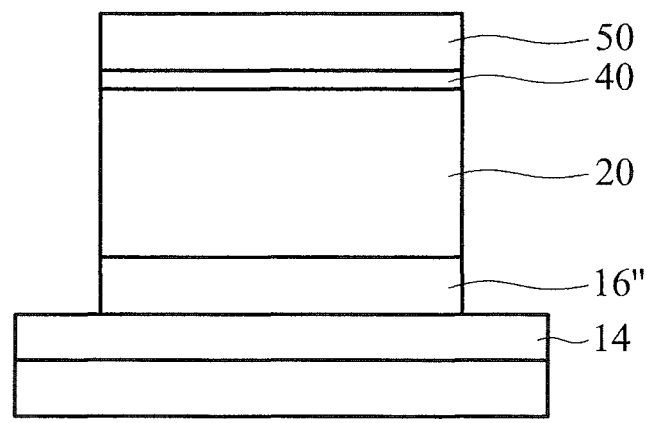
Figure 4D:
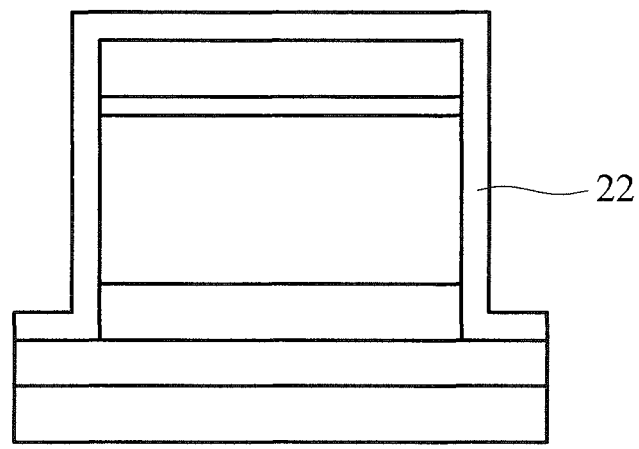
Figure 4E:
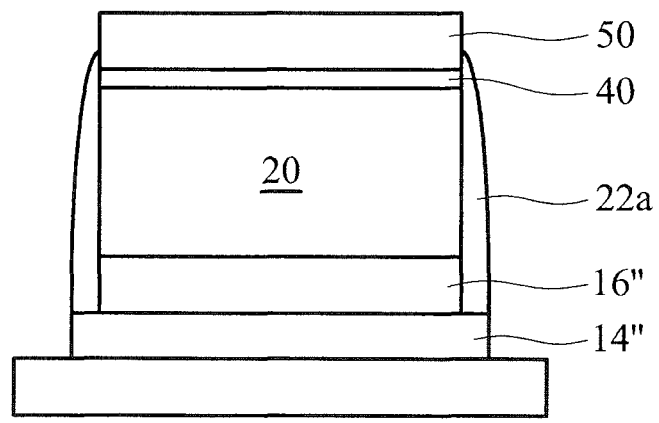

Next, as shown in FIG. 4B, the mask layer 18 is stripped, and the top surface 50a and the sidewall surfaces 50b of the solder layer 50 are exposed. The sidewall surfaces 40b of the cap layer 40 are also exposed at this step. Then the exposed portion of the second UBM layer 16 is etched as shown in FIG. 4C, exposing the underlying first UBM layer 14 outside the Cu pillar 20. Thereafter, as depicted in FIG. 4D, a protection layer 22 is formed on the resulted structure, to cover the solder layer 50, the cap layer 40, the sidewall surfaces 20b of the Cu pillar 20, the sidewall surfaces 16b of the patterned second UBM layer 16" and the exposed portion of the first UBM layer 14. After performing lithography and masking techniques and dry etch processes, a sidewall protection structure 22a is created as depicted in FIG. 4E. The top surface 50a of the solder layer 50 is therefore exposed. The first UBM layer 14 is then etched using the created structure 22a as the mask, exposing the underlying substrate 10.

Figure 4F:
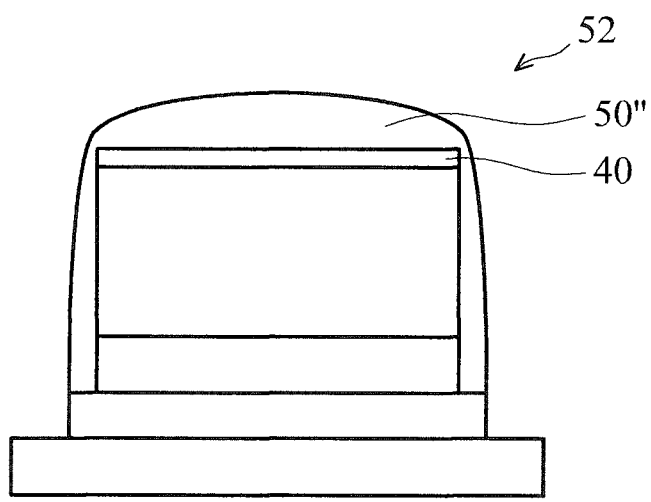

With reference to FIG. 4F, a reflowing process is performed on the solder layer 50 to form a reflowed solder layer 50" on the cap layer 40. This completes a bump structure 52 that includes the Cu pillar 20, the cap layer 40 on the Cu pillar 20, the reflowed solder layer 50" on the cap layer 40, the patterned second UBM layer 16" underlying the Cu pillar 20, the patterned first UBM layer 14" underlying the patterned second UBM layer 16" and having the peripheral surface 14a extending outside the sidewall surface 16b of the patterned second UBM layer 16", and the sidewall protection structure 22a covering the sidewall surfaces 40b, 20b and 16b and the peripheral surface 14a. The substrate 10 is then sawed and packaged onto a package substrate, or another die, with solder balls or Cu bumps mounted on a pad on the package substrate or the other die.

Figure 4G:
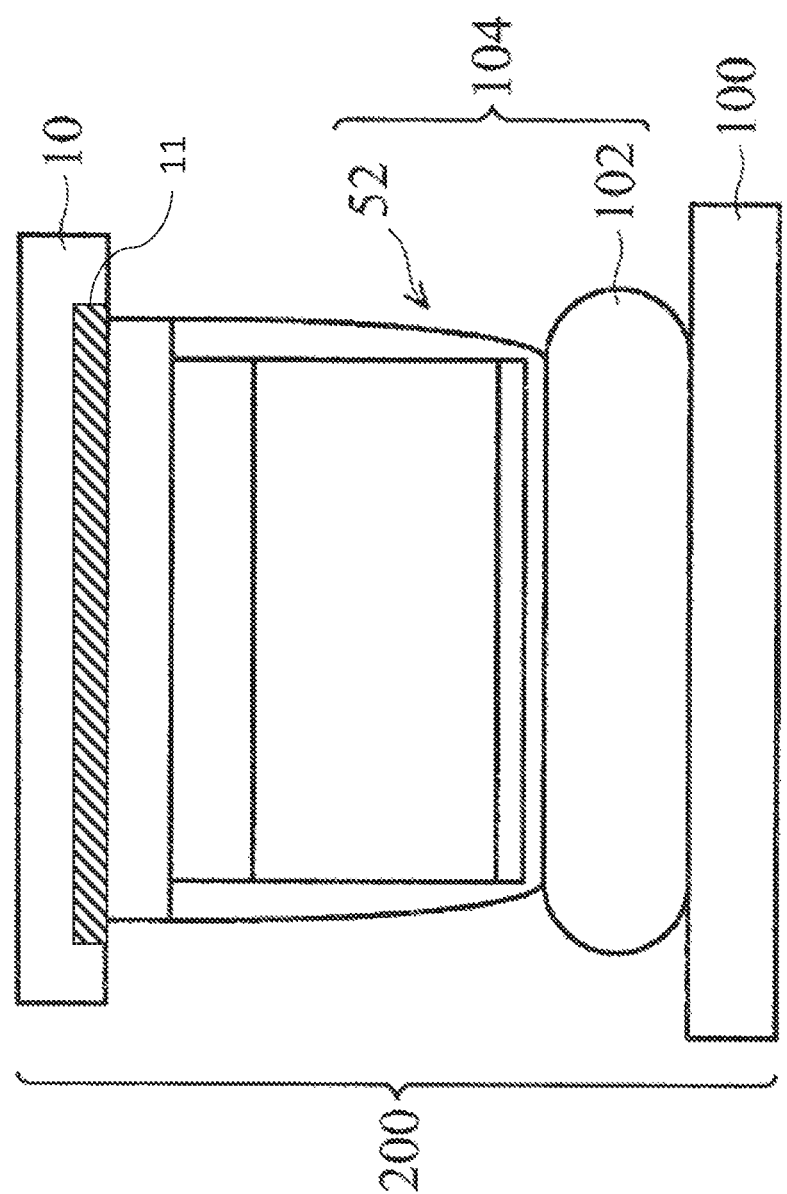

Referring to FIG. 4G, the substrate 10, including pad 11, is flipped upside down and attached to another substrate 100 at the bottom. The bump structure 52 contacts the substrate 100 at various conductive attachment points, for example, a joint solder layer 102 on contact pads and/or conductive traces, forming a joint structure 104 coupling the two substrates 10 and 100. The integrated circuit substrate 10, the joint structure 104, and the other substrate 100 may be referred to as a packaging assembly 200, or in the present embodiment, a flip-chip packaging assembly.

One aspect of this description relates to an integrated circuit device. The integrated circuit device includes a semiconductor substrate; and a pad region over the semiconductor substrate. The integrated circuit device further includes an under-bump-metallurgy (UBM) layer over the pad region. The integrated circuit device further includes a conductive pillar on the UBM layer, wherein the conductive pillar has a sidewall surface and a top surface. The integrated circuit device further includes a protection structure over the sidewall surface of the conductive pillar, wherein sidewalls of the UBM layer are substantially free of the protection structure, and the protection structure is a non-metal material.

Another aspect of this description relates to a method of forming a pillar structure. The method includes depositing an under-bump-metallurgy (UBM) layer formed on a pad region of a substrate. The method further includes plating a copper-containing pillar on the UBM layer, wherein the copper-containing pillar includes a sidewall surface and a top surface. The method further includes blanket depositing a protection structure on the copper-containing pillar. The method further includes etching the protection structure to remove the protection structure from the top surface of the copper-containing pillar. The method further includes etching the UBM layer using the etched protection structure as a mask.

Still another aspect of this description relates to a method of forming a semiconductor package. The method includes forming a mask layer over an under bump metallurgy (UBM) layer on a first substrate. The method further includes patterning the mask layer to define an opening therein. The method further includes plating a copper-containing layer in the opening; and removing the patterned mask layer. The method further includes blanket depositing a non-metal protection structure of the copper-containing layer and the UBM layer. The method further includes etching the protection structure to form sidewall spacers. The method further includes etching the UBM layer, wherein sidewalls of the etched UBM layer are free of the protection structure. The method further includes bonding the copper-containing layer to a second substrate.

In the preceding detailed description, the disclosure is described with reference to specifically exemplary embodiments thereof. It will, however, be evident that various modifications, structures, processes, and changes may be made thereto without departing from the broader spirit and scope of the disclosure, as set forth in the claims. The specification and drawings are, accordingly, to be regarded as illustrative and not restrictive. It is understood that the disclosure is capable of using various other combinations and environments and is capable of changes or modifications within the scope of the inventive concept as expressed herein.

What is claimed is:

1. An integrated circuit device, comprising:
   a semiconductor substrate;
   a pad over at least a portion of the semiconductor substrate;
   an under-bump-metallurgy (UBM) layer over the pad, wherein the UBM layer comprises a first UBM layer and a second UBM layer on the first UBM layer;
   a conductive pillar on the UBM layer, wherein the conductive pillar has a sidewall surface and a top surface, the conductive pillar comprises copper, an entirety of sidewalls of the conductive pillar are aligned with sidewalls of the second UBM layer, and a material of the first UBM layer is different from a material of the conductive pillar;
   a protection structure directly contacting a bottom-most portion of the sidewall surface of the conductive pillar, wherein each sidewall of the first UBM layer is substantially free of the protection structure, the protection structure is separated from the pad, the protection structure is a non-metal material, the protection structure has a tapered profile, and an outer-most edge of the protection structure is aligned with an outer-most edge of the first UBM layer; and a second substrate bonded to the conductive pillar.

2. The integrated circuit of claim 1, wherein the first UBM layer comprises at least one of titanium, tantalum, titanium nitride or tantalum nitride.

3. The integrated circuit of claim 1, wherein the first UBM layer has a thickness ranging from about 500 angstroms to about 2000 angstroms.

4. The integrated circuit of claim 1, wherein the protection structure directly contacts a top surface of the first UBM layer.

5. The integrated circuit of claim 1, further comprising a barrier layer over a top surface of the conductive pillar.

6. The integrated circuit of claim 1, further comprising a cap layer over the top surface of the conductive pillar.

7. The integrated circuit of claim 1, further comprising a joint solder layer between the conductive pillar and the second substrate.

8. The integrated circuit of claim 7, wherein the protection structure is between the sidewall surface of the conductive pillar and the joint solder layer.

9. The integrated circuit of claim 1, wherein a width of the protection structure varies along an entirety of the protection structure as a distance from the substrate increases.

10. The integrated circuit of claim 7, wherein the joint solder layer extends along the conductive pillar, wherein a portion of the joint solder layer is closer to semiconductor substrate than an uppermost surface of the conductive pillar.

11. An integrated circuit device, comprising:
a semiconductor substrate;
a pad over at least a portion of the semiconductor substrate;
a first under-bump-metallurgy (UBM) layer over the pad;
a second UBM layer over the first UBM layer, wherein the second UBM layer has a first width;
a conductive pillar on the second UBM layer, wherein the conductive pillar has a sidewall surface and a top surface, the conductive pillar comprises copper, an entirety of the conductive pillar has the first width, and a material of the first UBM layer is different from a material of the conductive pillar;
a protection structure directly contacting a bottom-most portion of the sidewall surface of the conductive pillar, wherein each sidewall of the first UBM layer is substantially free of the protection structure, the protection structure is separated from the pad, the protection structure is a non-metal material, the protection structure has a tapered profile, and an outer-most edge of the protection structure is aligned with an outer-most edge of the first UBM layer; and
a second substrate bonded to the conductive pillar.

12. The integrated circuit device of claim 11, wherein the protection structure covers sidewalls of the second UBM layer.

13. The integrated circuit device of claim 11, further comprising a printed circuit board bonded to the conductive pillar.

14. The integrated circuit device of claim 11, further comprising a package substrate bonded to the conductive pillar.

15. The integrated circuit device of claim 11, further comprising a solder layer over the conductive pillar, wherein at least a portion of sidewalls of the solder layer are substantially free of the protection structure.

16. The integrated circuit device of claim 15, wherein a width of the solder layer is substantially equal to a width of the conductive pillar.

17. The integrated circuit device of claim 11, further comprising a barrier layer over a top surface of the conductive pillar.

18. An integrated circuit device, comprising:
a semiconductor substrate;
a pad over at least a portion of the semiconductor substrate;
an under-bump-metallurgy (UBM) layer over the pad;
a conductive pillar on the UBM layer, wherein the conductive pillar has a sidewall surface and a top surface, the conductive pillar comprises copper, and a material of the UBM layer is different from a material of the conductive pillar;
a cap layer over the conductive pillar;
a protection structure directly contacting a bottom-most portion of the sidewall surface of the conductive pillar, wherein sidewalls of the cap layer are covered by the protection structure, each sidewall of the UBM layer is substantially free of the protection structure, the protection structure is separated from the pad, the protection structure is a non-metal material, the protection structure extends above a top-most surface of the conductive pillar, the protection structure has a tapered profile, and an outer-most edge of the protection structure is aligned with an outer-most edge of the UBM layer; and
a second substrate bonded to the conductive pillar.

19. The integrated circuit device of claim 18, further comprising a solder layer over the cap layer.

20. The integrated circuit device of claim 19, wherein at least a portion of sidewalls of the solder layer are substantially free of the protection structure.

* * * * *